United States Patent
Yoshihara (12)

(10) Patent No.: US 6,172,536 B1
(45) Date of Patent: Jan. 9, 2001

(54) HYSTERESIS COMPARATOR CIRCUIT

(75) Inventor: Toshio Yoshihara, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/348,079

(22) Filed: Jul. 6, 1999

(30) Foreign Application Priority Data

Jul. 7, 1998 (JP) .................................................. 10-192172

(51) Int. Cl.[7] .............................. H03K 5/22; H03K 5/153
(52) U.S. Cl. ............................ 327/87; 327/206; 327/205; 360/46; 360/51
(58) Field of Search ..................................... 327/205, 206, 327/77–79, 82, 83, 87, 89; 360/46, 51

(56) References Cited

U.S. PATENT DOCUMENTS

| 5,519,545 | * | 5/1996 | Kawahara ................................... | 360/46 |
| 5,552,942 | * | 9/1996 | Ziperovich et al. ....................... | 360/51 |
| 5,570,052 | * | 10/1996 | Fonderie et al. ......................... | 327/205 |
| 5,973,516 | * | 10/1999 | Bremner et al. ......................... | 327/205 |

* cited by examiner

Primary Examiner—Kenneth B. Wells
Assistant Examiner—Long Nguyen
(74) Attorney, Agent, or Firm—McGuireWoods LLP

(57) ABSTRACT

A hysteresis comparator circuit which has: a first differential input circuit that operates according to the difference between input voltage and reference voltage; an adder circuit that is composed of first and second addition input ends and differential output voltage of the first differential input circuit is input to the first and second addition input ends as first addition input; a quantizer that quantizes output voltage of the adder circuit and outputs the quantized value as output signal; an attenuator that attenuates output voltage of the quantizer; and a second differential input circuit that applies differential output obtained by differential-amplifying output voltage of the attenuator to the first and second addition ends as second addition input as well as forming a positive-feedback system.

11 Claims, 7 Drawing Sheets

HYSTERESIS COMPARATOR CIRCUIT

FIELD OF THE INVENTION

This invention relates to a hysteresis comparator circuit, and more particularly to, a hysteresis comparator circuit that is composed of a differential input circuit and an adder circuit.

BACKGROUND OF THE INVENTION

A comparator circuit with a hysteresis characteristic is called a hysteresis comparator circuit, and is used for, e.g., a zero cross detection circuit. Such a zero cross detection circuit has been used as a delay detection circuit of receiving device.

In recent years, it is used as a modulator-demodulator circuit of mobile communication equipment, such as a portable telephone and PHS (personal handyphone system). In this use, required are such high sensitivity that can receive a weak signal and such low consumed power that can make the battery last a long time. An example of a hysteresis comparator circuit that complies with these requirements is disclosed in Japanese patent application laid-open No. 64-073906 (1989). This circuit is explained in detail below.

FIG. 1 shows the composition of the conventional hysteresis comparator circuit. Hereinafter, in transistors, PMOS means a p-type MOS (metal oxide semiconductor), and NMOS means n-type MOS.

The hysteresis comparator circuit is composed of input terminals 201, 202 and 203, a first differential input circuit 204 connected with these input terminals, an adder circuit 205, a current switching circuit 206, a PMOS transistor 207, a NMOS transistor 208 with a gate connected with the input terminal 203, a quantizer 209 and a NMOS transistor 210.

The output end of the quantizer 209 is connected with an output terminal 211. The NMOS transistor 210 has a gate connected with the input terminal 203 and a drain connected with the low-potential side of the current switching circuit 206. The adder circuit 205 is disposed between the first differential input circuit 204 and a high-potential power source 212. The gate of the PMOS transistor 207 is connected with output point B of the adder circuit 205. The input end of the quantizer 209 is the drains of the PMOS transistor 207 and the NMOS transistor 208.

The first differential input circuit 204 is composed of a NMOS transistor 204a with a gate connected with the input terminal 202, a NMOS transistor 204b with a gate connected with the input terminal 201, and a NMOS transistor 204c with a gate connected with the input terminal 203. The drain of the NMOS transistor 204c is connected with the sources of the NMOS transistor 204a, 204b. The adder circuit 205 is composed of PMOS transistors 205a, 205b that have gates connected commonly and have drains connected with the drains of the NMOS transistors 204a, 204b, respectively.

The current switching circuit 206 is composed of NMOS transistors 206a, 206b. The gate of the NMOS transistor 206a is connected with the output of the quantizer 209 and the output terminal 211. The sources of the NMOS transistors 206a, 206b are connected each other, and the drains thereof are connected with the drains of the PMOS transistors 205a, 205b. Further, the sources of the NMOS transistors 206a, 206b are connected with the drain of the NMOS transistor 210. The quantizer 209 is composed of two inverters 209a, 209b connected in series, and generates an output signal when a signal of higher than a certain level is input. The NMOS transistor 210 operates as a constant current source.

FIG. 2 shows operation waveforms of the hysteresis comparator circuit in FIG. 1. The first differential input circuit 204 and the adder circuit 205 form a comparator. As shown in FIG. 2 (a), reference voltage ($V_{REF}$) is applied to the input terminal 201, input voltage $V_{IN}$ is applied to the input terminal 202, constant voltage (bias voltage) is applied to the input terminal 203, the NMOS transistors 204c, 208 and 210 each function as a constant current source. Here, when voltages at output points m, n of the adder circuit 205 are equal, i.e., when $I_1$ and $I_2$ to flow through the PMOS transistors 205a, 205b, respectively are equal, is the threshold value of comparator.

When as shown in FIG. 2 (a) the relation of $V_{REF}>V_{IN}$ is given, drain currents $I_a$, $I_b$ flow through the NMOS transistors 204a, 204b as shown in FIG. 2 (d). In this gate, since the PMOS transistor 207 turns on and the input of the quantizer 209 is at H level, the output terminal 211 outputs output voltage $V_{211}$ of H level as shown in FIG. 2 (a). Since the NMOS transistor 206a turns on inputting voltage $V_{211}$ of the output terminal 211, drain current $I_o$ (=drain current α of the NMOS transistor 210) flows through the NMOS transistor 206a but does not flow through 206b.

Then, as shown in FIG. 2 (a), when $V_{IN}$ increases gradually and the relation of $V_{IN}>V_{REF}$ occurs at time point $t_1$, drain current $I_c$ of the NMOS transistor 204a tends to increase and drain current $I_d$ of the NMOS transistor 204b tends to reduce. With this change, drain current $I_b$ of the PMOS transistor 205b starts reducing and the potential of point n starts lowering gradually. When it lowers to a certain value, voltage that the inverter 209a can start operating is input to the inverter 209a. This time point is $t_2$, when the output of the inverter 209a turns into H level and the output of the inverter 209b turns into L level. Therefore, as shown in FIG. 2 (b), the NMOS transistor 206b turns into ON state, and at the same time, as shown in FIG. 2 (c), the NMOS transistor turns into OFF state. This time point ($t_2$) when the output change occurs is later than time point $t_1$ when $V_{IN}>V_{REF}$ occurs. Namely, a hysteresis characteristic is obtained. Hereupon, as shown in FIG. 2 (d), current $I_a$, i.e., the sum of (drain current $I_c$ of the NMOS transistor 204a–drain current $I_f$ of the NMOS transistor 206b), flows through the PMOS transistor 205a of the adder circuit 205, and drain current $I_b$ of the PMOS transistor 205b reduces. Also, as shown in FIG. 2 (e), drain current α of the NMOS transistor 210 increases in response to the switching of NMOS transistors 204a and 204b.

Then, after the output terminal 211 becomes L level, as $V_{IN}$ starts reducing gradually, drain current $I_d$ of the NMOS transistor 204b starts increasing responsively and, on the contrary, drain current $I_c$ of the NMOS transistor 204a starts reducing. Then, at time point $t_3$, it turns into $V_{REF}>V_{IN}$. However, at time point $t_3$, since the drain output of the PMOS transistor 207 does not increase up to such voltage that can make the quantizer 209 and the current switching circuit 206 operate, the inverter 209a does not come to operation. At time point $t_4$ a little later than the time point when turned into $V_{REF}>V_{IN}$, the input of the inverter 209a reaches H level, when the output of the inverter 209a turns into L level and the output of the inverter 209b turns into H level. Namely, the voltage level of the output terminal 211 turns from L level into H level. That this time point $t_4$ is later than time point $t_3$ shows a hysteresis characteristic is provided.

Thus, the comparator circuit in FIG. 1 conducts the hysteresis operation that when the start turns into $V_{IN}>V_{REF}$ or $V_{REF}>V_{IN}$, the voltage level of the output terminal 211 changes delaying.

SUMMARY OF THE INVENTION

Accordingly, it is an object of the invention to provide a hysteresis comparator circuit that is less affected by the dispersion in device or the temperature and has an excellent response characteristic for rinsing and falling while lowering the consumed power.

According to the invention, a hysteresis comparator circuit, comprises:

- a first differential input circuit that operates according to the difference between input voltage and reference voltage;
- an adder circuit that is composed of first and second addition input ends and differential output voltage of the first differential input circuit is input to the first and second addition input ends as first addition input;
- a quantizer that quantizes output voltage of the adder circuit and outputs the quantized value as output signal;
- an attenuator that attenuates output voltage of the quantizer; and
- a second differential input circuit that applies differential output obtained by differential-amplifying output voltage of the attenuator to the first and second addition ends as second addition input as well as forming a positive-feedback system.

BRIEF DESCRIPTION OF THE DRAWINGS

The invention will be explained in more detail in conjunction with the appended drawings, herein.

DESCRIPTION OF THE PREFERRED EMBODIMENTS

Figure 1:
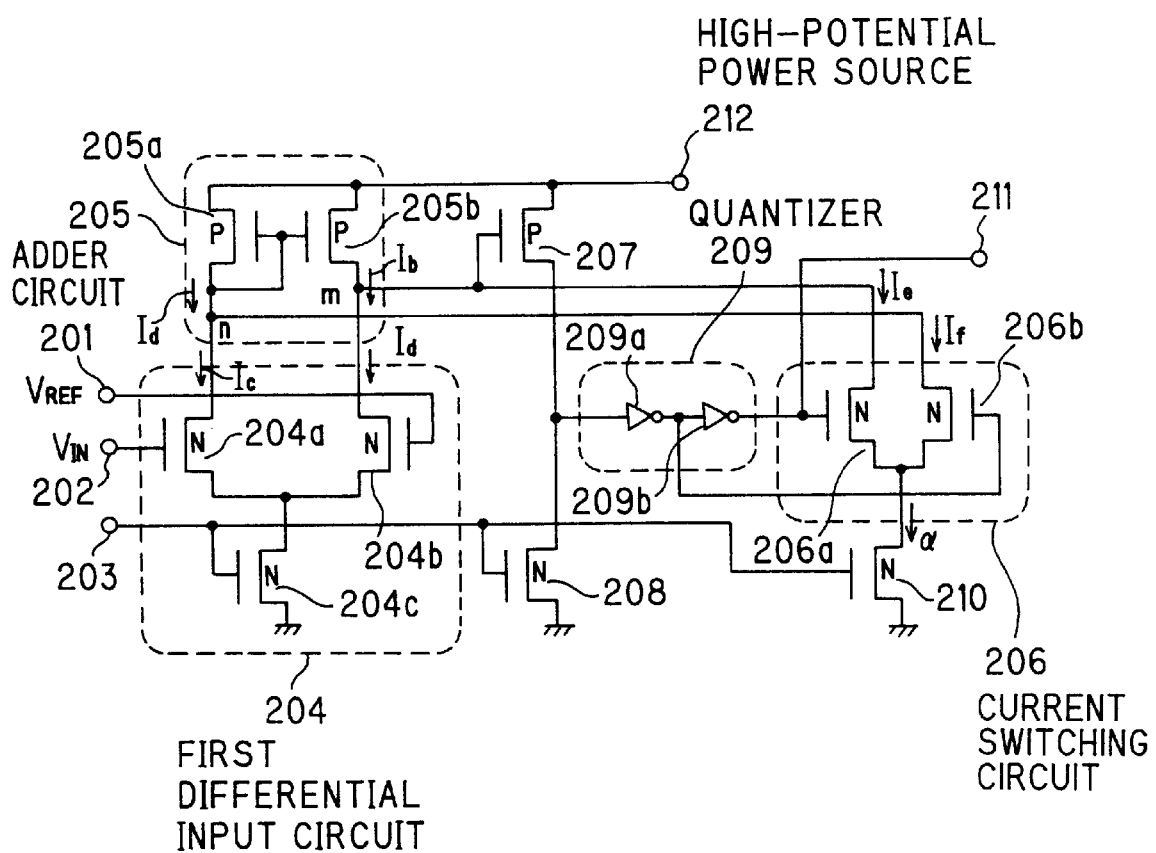
FIG. 1 is a circuit diagram showing the composition of the conventional hysteresis comparator circuit.
Figure 2:
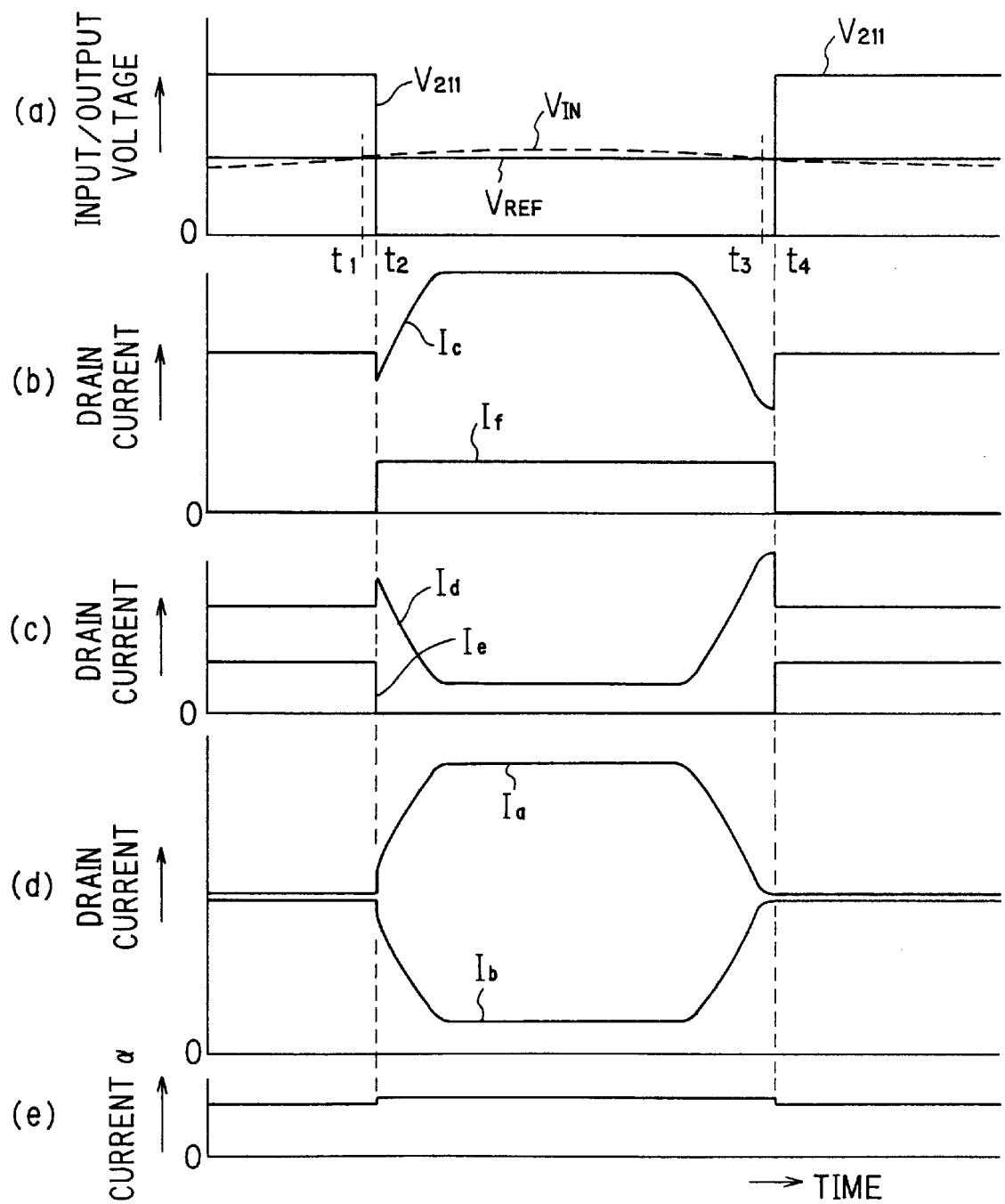
FIG. 2 is a waveform diagrams showing the operation waveform of the hysteresis comparator circuit in FIG. 2.

The preferred embodiments of the invention will be explained below, referring to the drawings.

Figure 3:
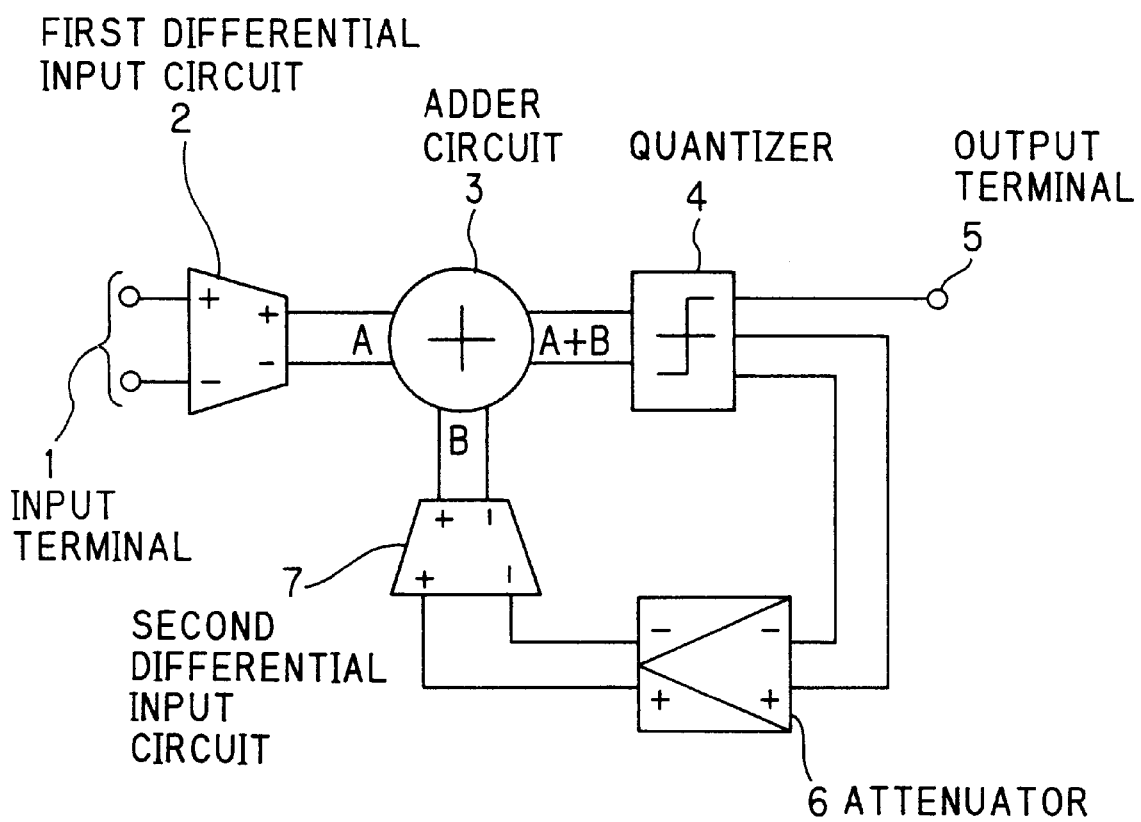
FIG. 3 is a block diagram showing the principle composition of a hysteresis comparator circuit according to the invention.

FIG. 3 shows the principled composition of a hysteresis comparator circuit according to the invention.

The hysteresis comparator circuit of the invention is composed of a first differential input circuit 2 connected with an input terminal 1, an adder circuit 3 connected with the first differential input circuit 2, a quantizer 4 connected with the adder circuit 3, an output terminal 5 connected with the output of the quantizer 4, an attenuator 6 connected with the quantizer 4, and a second differential input circuit 7 disposed between the attenuator 6 and the adder circuit 3.

In the composition in FIG. 3, the output signal of the first differential input circuit 2 and the output signal of the second differential input circuit 7 are added by the adder circuit 3. The output of the adder circuit 3 is quantized by the quantizer 4. A signal quantized by the quantizer 4 is attenuated by a given amount of attenuation by the attenuator 6, and then is applied to the second differential input circuit 7. The output of the second differential input circuit 7 is at an output level according to the attenuation condition by the attenuator 6. The output of the second differential input circuit 7 is positive-feedbacked as a hysteresis width converted into the input level of the first differential input circuit 2 according to the ratio of amplification characteristic of the two differential input circuits. Hereupon, the attenuator 6 functions so that signal input to the second differential input circuit 7 locates in the non-saturation region of the second differential input circuit 7.

Next, the operation of the hysteresis comparator circuit composed as shown in FIG. 3 will be explained. The gain of the first differential input circuit 2 is $K_1$, the gain of the first differential input circuit 7 is $K_2$, and the attenuation amount of the attenuator 6 is a positive real number, K3. Also, the quantizer 4 outputs +1 when the output of the adder circuit 3 is positive, and outputs −1 when negative. When the output of the adder circuit 3 is positive, output voltage $V_B$ of the second differential input circuit 7 is given by equation (1).

$$V_B = K_3 \times K_2 \qquad (1)$$

On the other hand, output voltage $V_A$ of the first differential input circuit 2 is given by equation (2).

$$V_A = V_{IN} \times K_1 \qquad (2)$$

The inversion of the output of the quantizer 4 occurs when the output of the adder circuit 3 is at zero level. Hereupon, equation (3) is established.

$$V_A + V_B = 0 \qquad (3)$$

calculating input voltage $V_{IN}$ from equations (1) to (3), equation (4) is established.

$$V_{IN} = (-K_3) \times K_2 / K_1 \qquad (4)$$

In like manner, when the output of the adder circuit 3 is negative, the following equations are established.

$$V_B = (K_3) \times K_2 \quad (5)$$

$$V_A = V_{IN} \times K_1 \quad (6)$$

$$V_A + V_B = 0 \quad (7)$$

Calculating input voltage $V_{IN}$ from equations (5) to (7), equation (8) is established.

$$V_{IN} = K_3 \times K_2 / K_1 \quad (8)$$

As described above, with the attenuator 6 and the second differential input circuit 7, output signal quantized (digitized) into a certain amplitude by the quantizer 4 is attenuated, then amplified by the second differential input circuit 7 identical or analogous to the first differential input circuit 2. By positive-feedbacking this amplified output, the hysteresis width can be made to be identical or proportional to the output of the attenuator 6. Therefore, the matching of response time between rise signal and fall signal can be obtained. Also, by making the first and second differential input circuits identical or analogous to each other, the variation of values obtained by the above equations including gains $K_2$, $K_1$ can be reduced, therefore the hysteresis comparator circuit with a stable characteristic can be obtained.

Figure 4:
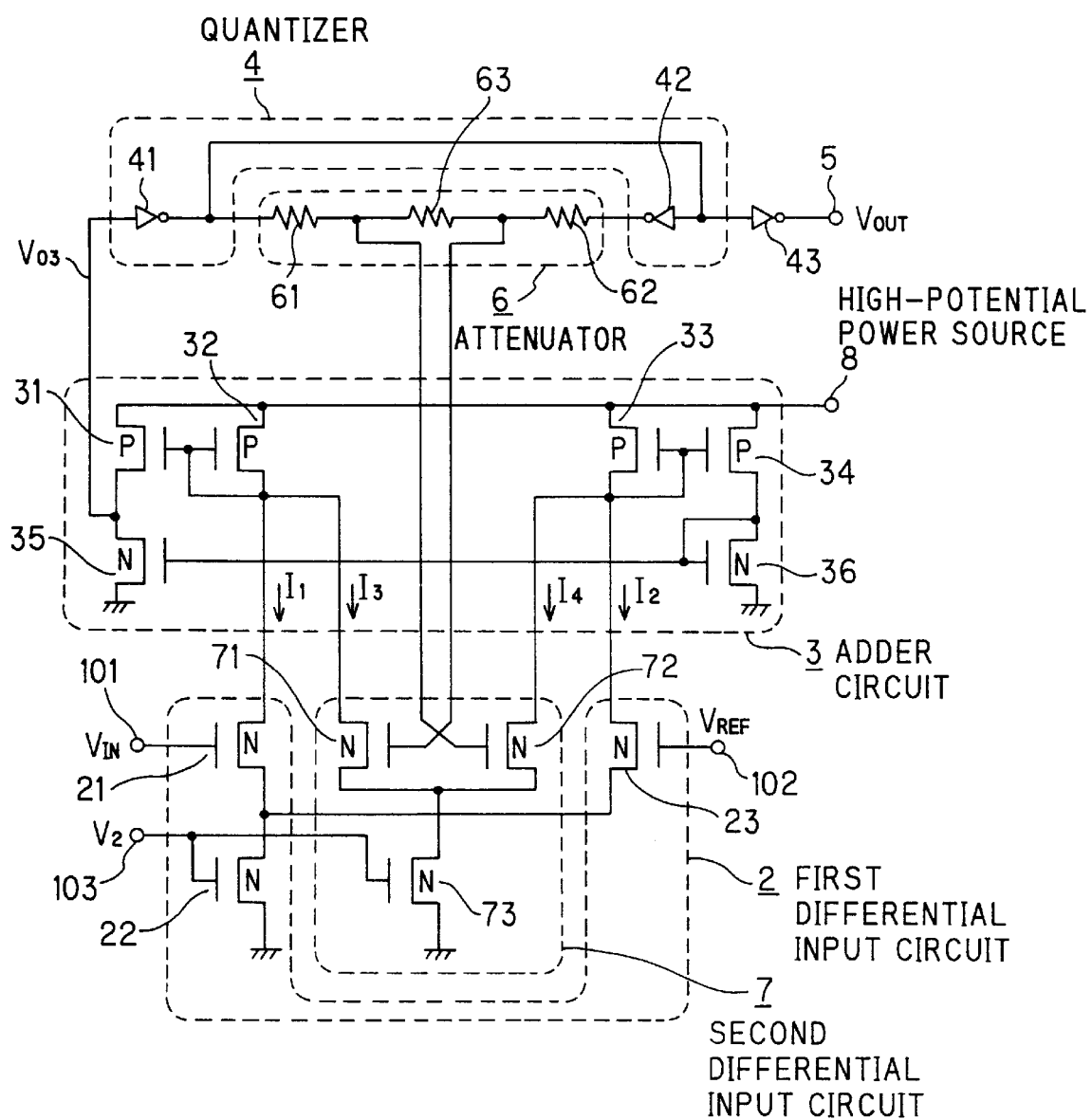
FIG. 4 is a circuit diagram showing a hysteresis comparator circuit in a first preferred embodiment according to the invention.

FIG. 4 shows a hysteresis comparator circuit in the first preferred embodiment according to the invention. This hysteresis comparator circuit materializes the composition of FIG. 3.

The first differential input circuit 2 is composed of NMOS transistors 21 (first MOS transistor), 22 (second MOS transistor) and 23 (third MOS transistor), and operates as a differential amplification circuit. The gates of the NMOS transistors 21, 23 are connected to input terminals 101 (non-inversion terminal) and 102 (inversion terminal), respectively, the sources thereof are connected to the drain of the NMOS transistor 22, the drains thereof are connected to the adder circuit 3. The gate of the NMOS transistor 22 is connected to an input terminal 103 (bias terminal), and the source thereof is grounded.

The adder circuit 3 is compose of PMOS transistors 31 (first MOS transistor), 32 (second MOS transistor), 33 (fourth MOS transistor), 34 (fifth MOS transistor) and 35 (third MOS transistor), and NMOS transistors 35 (second MOS transistor) and 36 (sixth MOS transistor). The PMOS transistos 31, 32 compose a first current mirror circuit, the PMOS transistors 33, 34 compose a second current mirror circuit, the differential output of the first and second differential input circuits 2, 7 are connected to the respective current mirror circuits so that they are added (current addition). The drain of the PMOS transistor 32 is a first addition input end, and the drain of the PMOS transistor 33 is a second addition input end. Also, the NMOS transistors 35, 36 compose an active load circuit. The gates of the NMOS transistors 35, 36 are connected to the drain of the NMOS transistor 36, the drain of the NMOS transistor 35 is connected to the drain of the PMOS transistor 31, the drain of the NMOS transistor 36 is connected to the drain of the PMOS transistor 34.

The quantizer 4 is composed of an inverters 41 (first inverter), 42 (second inverter) and 43. The input end of the inverter 41 is connected to the output of the adder circuit 3, and the output end thereof is connected to the respective input ends of the inverters 42, 43. The output end of the inverter 43 is connected to the output terminal 5.

The attenuator 6 is a voltage dividing circuit composed of a resistor 61 connected to the output end (first input end) of the inverter 41, a resister 62 connected to the output end (second input end) of the inverter 43, and a resistor 63 connecting the resistors 61 and 62. Both ends of the resistor 63 form the first and second output ends, which are connected to the input ends (respective gates of NMOS transistors 71, 72) of the second differential input circuit 7.

The second differential input circuit 7 is a differential amplification circuit composed of the NMOS transistors 71 (first MOS transistor), 72 (second MOS transistor) and 73 (third MOS transistor), and has the same composition as the first differential input circuit 2. The gates of the NMOS transistors 71, 72 are connected to both ends of the resistor 63, and the sources thereof are connected commonly. Further, the drain of the NMOS transistor 71 is connected to the drain of the PMOS transistor 32, the drain of the NMOS transistor 72 is connected to the drain of the PMOS transistor 33. The sources of the NMOS transistors 71, 72 are connected to the drain of the NMOS transistor 73, the source of the NMOS transistor 73 is grounded.

Figure 5:
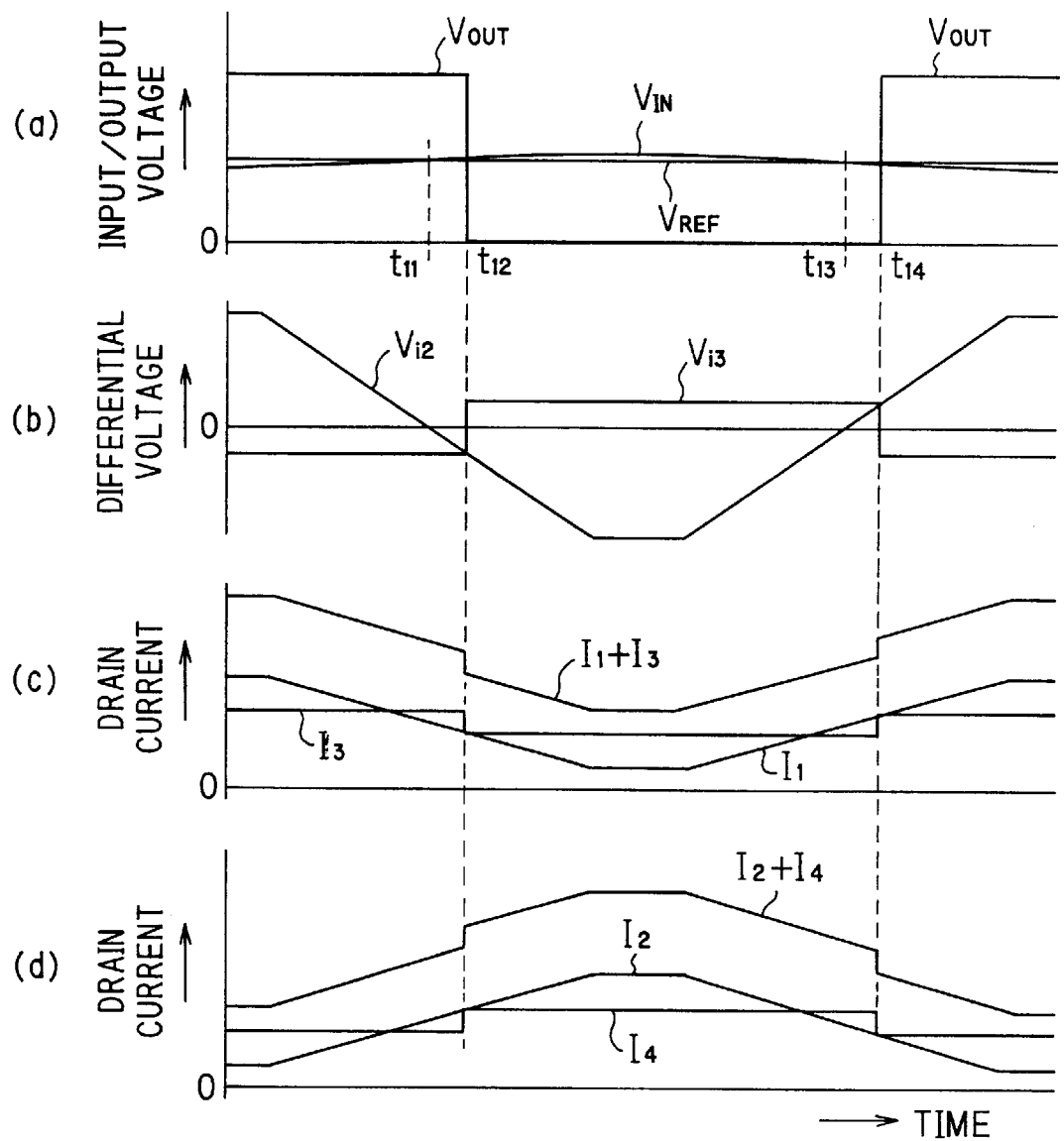
FIG. 5 is waveform diagrams showing the operation waveform of the hysteresis comparator circuit in FIG. 4.
Figure 6:
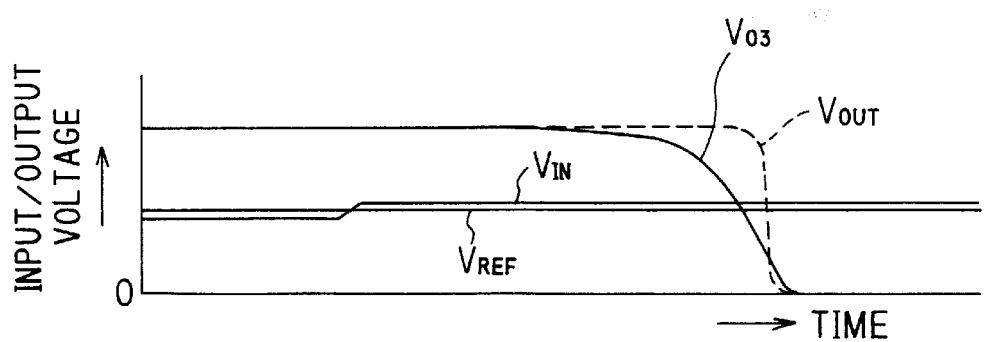
FIG. 6 is a waveform diagram showing the waveforms of input voltage and output voltage in input change in the hysteresis comparator circuit in FIG. 4.

FIGS. 5 and 6 are waveforms in the hysteresis comparator circuit in FIG. 4. Here, the waveforms are given for the composition of ± two power sources where a negative power source is connected to the ground level in FIG. 4.

In FIG. 4, to the input terminal 102 reference voltage $V_{REF}$ for comparison is applied, and to the input terminal 103 constant bias voltage $V_2$ to operate the NMOS transistors 22, 73 as constant current sources is applied. In this state, when input signal $V_{IN}$ with potential lower than $V_{REF}$ is input to the input terminal 101, as shown in FIGS. 5 (c) and (d), drain currents $I_1$, $I_2$ of the first differential input circuit 2 flow through the NMOS transistor 21 more than the NMOS transistor 23. Also, through the NMOS transistors 71, 72, drain currents $I_2$, $I_4$ flow according to the current-flow condition of the NMOS transistors 21, 23. Hereupon, drain voltage of the PMOS transistor 31 is H level near a high-potential power source 8, output voltage of the inverter 41 is L level, output voltage of the inverters 42, 43 is L level. Output voltage $V_{OUT}$ of the output terminal 5 is H level as shown in FIG. 5 (a).

As input signal $V_{IN}$ of the input terminal 102 increases gradually, as shown in FIGS. 5 (c) and (d), drain current $I_2$ of the NMOS transistor 21 tends to reduce and drain current $I_2$ of the NMOS transistor 23 tends to increase. Hereupon, since the operation of the quantizer 4 does not change, to the NMOS transistor 71 H level of voltage, which is the output of the inverter 42, is applied through the resistor 62 of the attenuator 6. To the NMOS transistor 72 L level of voltage, which is the output of the inverter 41, is applied through the resistor 61.

At time point $t_{11}$ shown in FIGS. 5 (a) and 6, input signal $V_{IN}$ exceeds the level of reference voltage $V_{REF}$, then drain current $(I_1+I_3)$ of the PMOS transistor 32 increases and, on the contrary, drain current $(I_2+I_4)$ of the PMOS transistor 33 reduces. Due to this, as shown in FIG. 6, drain voltage of the PMOS transistor 31 and the NMOS transistor 35 starts shifting to the low-voltage side.

When coming to time point $t_{12}$, drain voltage of the PMOS transistor 31 reaches such voltage that the inverter 41 can operate and output voltage of the inverter 41 becomes H level. Thereby, output voltage of the inverters 42 and 43 changes into L level. Time point $t_{12}$ is later than time point $t_{11}$. Namely, a hysteresis characteristic is obtained. In this state, the resistor 61 side becomes H level and the resistor 62 side becomes L level. As a result, in the second differential input circuit 7, H level of voltage is applied to the gate of the NMOS transistor 71 and L level of voltage is applied to the gate of the NMOS transistor 72. Due to this, as shown in FIGS. 5 (c) and (d), drain current $I_3$ of the NMOS transistor 71 increases stepwise and drain current $I_4$ of the NMOS transistor 72 reduces stepwise. This state means that the positive feedback occurs. As a result, drain voltage of the PMOS transistor 31 continues to keep L level.

Then, as input signal $V_{IN}$ starts reducing after output voltage of the output terminal 5 turns into L level, as shown in FIG. 5 (b), differential input voltage of the first differential input circuit 2 starts increasing gradually. When coming to time point $t_{13}$, $V_{REF}$ (reference voltage)=$V_{IN}$ is obtained. However, since, the inverter 41 does not operate, the operation of the second differential input circuit 7 does not change. Further, as $V_{IN}$ reduces lower than $V_{REF}$, drain voltage of the PMOS transistor 31 starts shifting to the H level side, finally, at time point $t_{14}$, reaching H level of voltage where the inverter 41 can operate. When input voltage of the inverter 41 become s H level, its output turns into L level, and further output of the inverter 42, 43 turns into H level. Accordingly, output voltage of the output terminal 5 changes from L level into H level. Time point $t_{14}$ comes later than time point $t_{13}$. Namely, it is found that a hysteresis characteristic is also obtained in rising of waveform.

Also, in the attenuator 6, output voltage of the resistor 61 turns into L level and output voltage of the resistor 62 turns into H level. Therefore, at time point $t_{14}$, as shown in FIGS. 5 (c) and (d), drain current $I_3$ of the NMOS transistor 71 increases stepwise, and simultaneously drain current $I_4$ of the NMOS transistor 72 reduces stepwise. Accordingly, drain current ($I_1+I_3$) of the PMOS transistor 32 increases and drain current ($I_2+I_4$) of the PMOS transistor 33 reduces. This state is kept until $V_{IN}$>$V_{REF}$ occurs.

Figure 7:
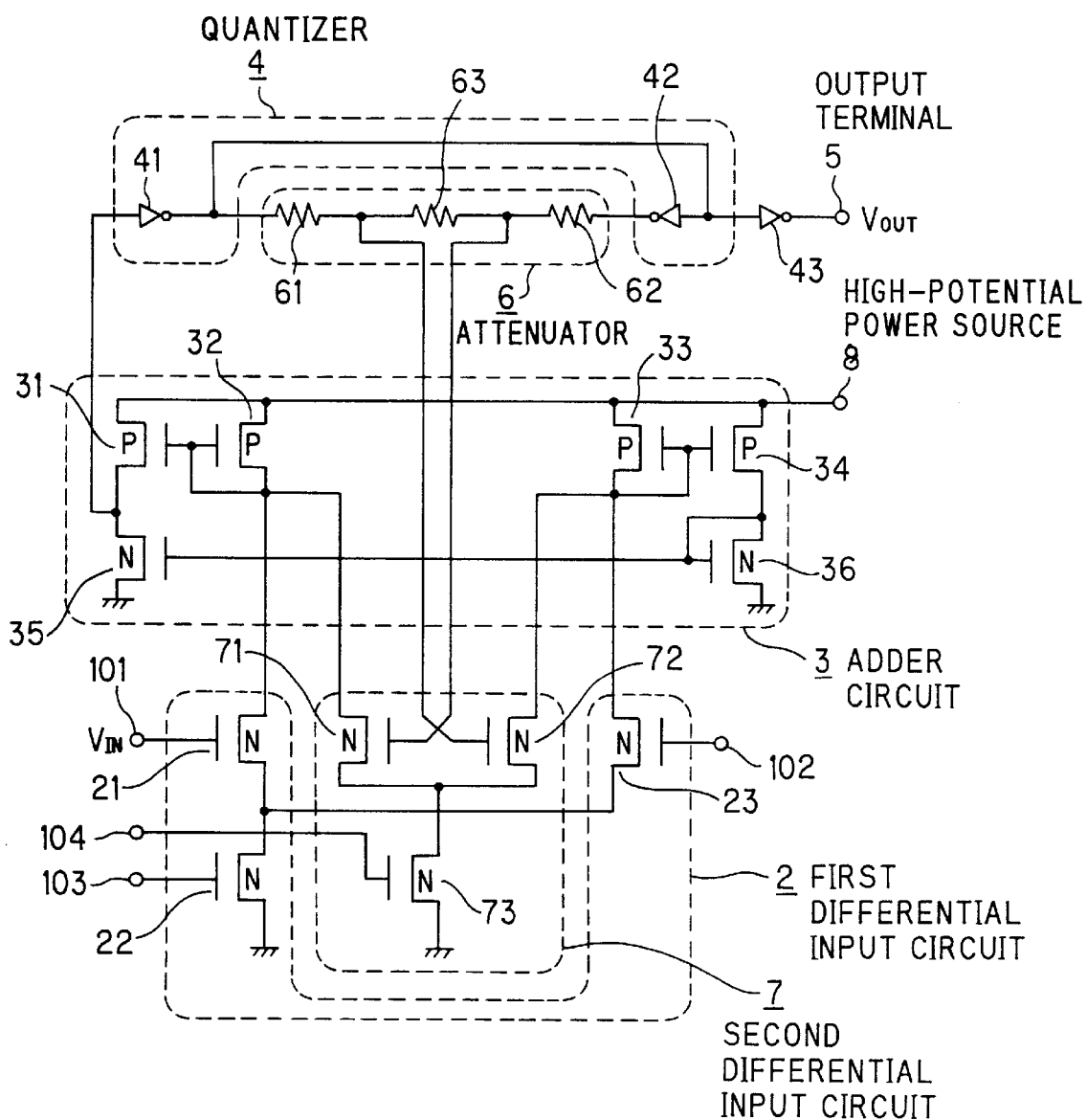
FIG. 7 is a circuit diagram showing a hysteresis comparator circuit in a second preferred embodiment according to the invention.

FIG. 7 shows a hysteresis comparator circuit in the second preferred embodiment according to the invention.

In the hysteresis comparator circuit in FIG. 7, the gate of the NMOS transistor 73, which operates as a constant current source, in the second differential input circuit 7 in FIG. 4 is connected to a second bias terminal 104. The other composition is as shown in FIG. 4, and therefore the repetition of explanation is omitted herein. With the second differential input circuit 7 equipped with the second bias terminal 104, the gain of second differential input circuit 7 can be controlled according to voltage applied to the bias terminal 104. Therefore, in the embodiment in FIG. 7, an effect that the hysteresis width can be controlled by external voltage is obtained.

Figure 8:
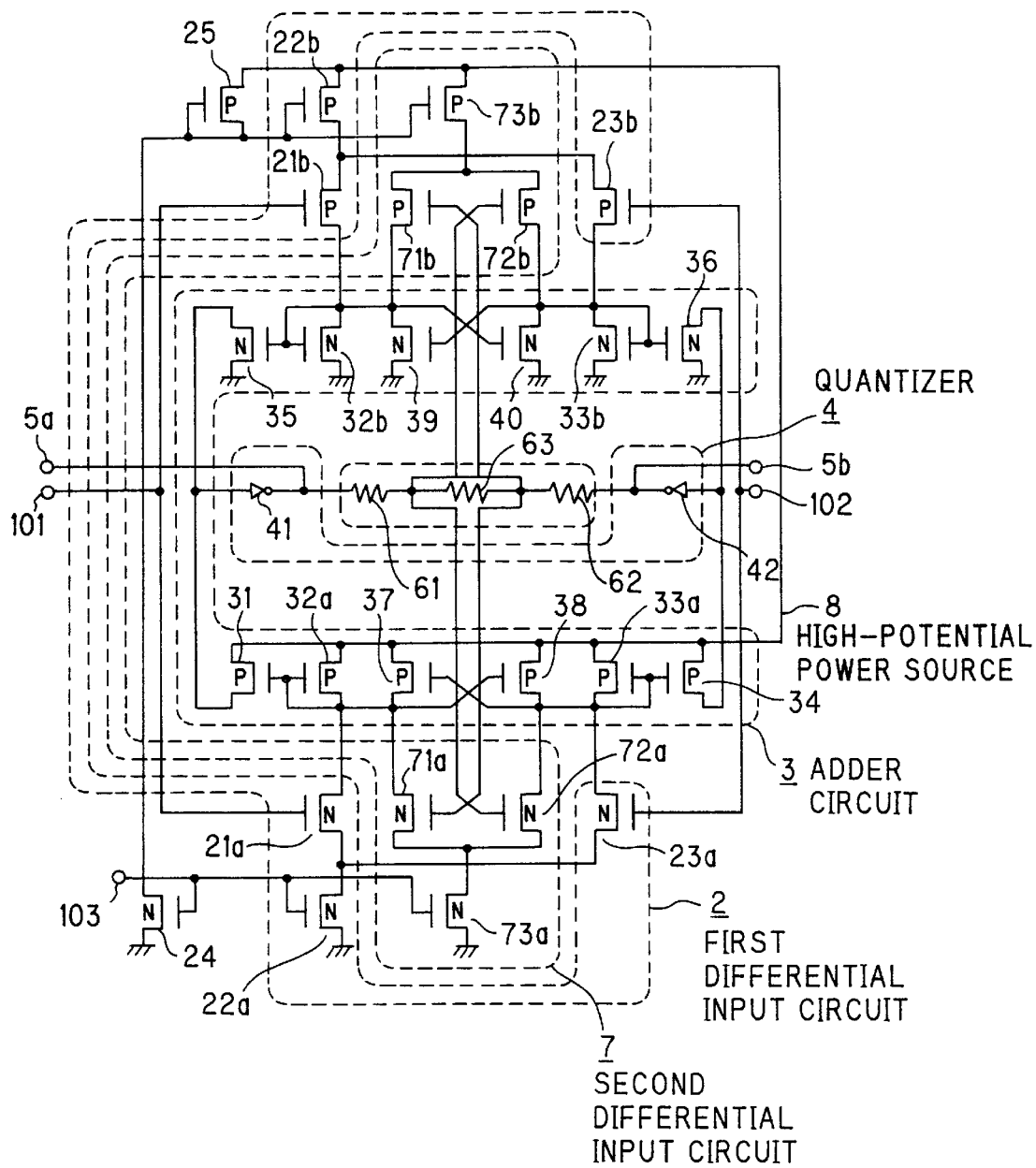
FIG. 8 is a circuit diagram showing a hysteresis comparator circuit in a third preferred embodiment according to the invention.

FIG. 8 shows a hysteresis comparator circuit in the third preferred embodiment according to the invention. This embodiment is characterized by that the first differential input circuit 2, the second differential input circuit 7 and the adder circuit 3 are composed of bipolar complementary circuit. Namely, two of the hysteresis comparator circuits in FIG. 4 are provided. One has the same composition as shown in FIG. 4, and another has a composition that P and N polarities of the transistors in FIG. 4 are reversed. Thus, it has a complementary connection type of composition that two hysteresis comparator circuits with different polarities are connected in parallel.

So, in FIG. 8, in order to make the circuit composition clear, the components of circuit part shown in FIG. 4 are represented with a code 'a' attached, and the components of circuit part with reverse polarity added newly are represented with a code 'b' attached. Thus, the two circuit parts are differentiated.

The first differential input circuit 2 is a differential input circuit composed of NMOS transistors 21a, 22a and 23a. A differential input circuit composed of PMOS transistors 21b, 22b and 23b is provided symmetrically to the differential input circuit composed of NMOS transistors 21a, 22a and 23a. Further, the first differential input circuit 2 is provided with a NMOS transistor 24 and a PMOS transistor 25. The NMOS transistor 24 has a gate connected to the input terminal 103, a drain connected to the gates of the NMOS transistors 22b and 73b, and a source connected to the ground. The PMOS transistor 25 has a source connected to the high-potential power source 8, a drain connected to the gate of the PMOS transistor 22b and 73b, and a gate connected to the drain.

In the second differential input circuit 7, a differential input circuit composed of PMOS transistors 71b, 72b and 73b is provided symmetrically to a differential input circuit composed of NMOS transistors 71a, 72a and 73a.

In the adder circuit 3, the second block composed of NMOS transistors 31b, 32b, 34b and 35b is provided symmetrically to the first block composed of PMOS transistors 31a, 32a, 34a and 35a. Further, the adder circuit 3 is provided with PMOS transistors 37, 38 and NMOS transistors 39, 40. The PMOS transistor 37 has a source connected to the high-potential power source 8, a drain connected to the drain of the PMOS transistor 32a, and a gate connected to the drain of the NMOS transistor 72a. The PMOS transistor 38 has a source connected to the high-potential power source 8, a drain connected to the drain of the PMOS transistor 33a, and a gate connected to the drain of the PMOS transistor 37. The NMOS transistor 39 has a drain connected to the drain of the NMOS transistor 32b, a gate connected to the drain of the NMOS transistor 40, and a source connected to the ground. Also, the NMOS transistor 40 has a drain connected to the drain of the NMOS transistor 33b, a gate connected to the drain of the NMOS transistor 39, and a source connected to the ground.

The composition of the quantizer 4 and the attenuator 6 other than the circuit part explained above is as shown in FIG. 4, and they do not need any additional component.

The operation of the hysteresis comparator circuit in FIG. 8 is similar to that in the first embodiment, except that either of the circuit parts operates according to the polarity of input voltage. Therefore, the repetition explanation is omitted herein.

With the composition in FIG. 8, the range of in-phase input voltage can be widened and the input-output characteristic of detector can be improved. Also, with the complementary type differential input stages, the difference between rising response time and falling response time to single-end input signal can be reduced, and the response characteristic can be improved.

Although in the above embodiments NMOS transistors and PMOS transistors are combined, the polarity of these transitions may be counterchanged. Also, in place of a MOS transistor, a bipolar transistor may be used.

ADVANTAGES OF THE INVENTION

In the hysteresis comparator circuit of the invention, output of the quantizer is attenuated, differential-amplified by the second differential input circuit, then added to differential amplification output of the first differential input circuit. Therefore, it can be less sensitive to some variation of transistor performance on integrated circuit, and the hysteresis width of the hysteresis comparator circuit can be stabilized.

Further, since the embodiments above have a characteristic that the hysteresis width is dependent on the attenuation amount of the attenuator, the hysteresis width can be changed easily by changing the attenuation amount of the attenuator.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A hysteresis comparator circuit, comprising:
    a first differential input circuit that operates according to the difference between input voltage and reference voltage;
    an adder circuit that is composed of first and second addition input ends and differential output voltage of said first differential input circuit is input to said first and second addition input ends as first addition input;
    a quantizer that quantizes output voltage of said adder circuit and outputs the quantized value as output signal;
    an attenuator that attenuates output voltage of said quantizer; and
    a second differential input circuit that applies differential output obtained by differential-amplifying output voltage of said attenuator to said first and second addition ends as second addition input as well as forming a positive-feedback system.

2. A hysteresis comparator circuit, according to claim 1, wherein:
    said first and second differential input circuits have a same or analogous amplification characteristic.

3. A hysteresis comparator circuit, according to claim 1, wherein:
    said second differential input circuit is composed of a constant current source; and
    the gain of said second differential input circuit is controlled according to bias voltage applied to an input terminal of said constant current source.

4. A hysteresis comparator circuit, according to claim 1, wherein:
    said first differential input circuit, said second differential input circuit and said adder circuit compose bipolar complementary circuits.

5. A hysteresis comparator circuit, according to claim 1, wherein:
    said attenuator is set to have such an attenuation factor that allows said second differential input circuit to operate in non-saturation region.

6. A hysteresis comparator circuit, according to claim 1, wherein:
    said first differential input circuit is composed of first and second MOS transistors with same polarity, and a third MOS transistor connected to the sources of said first and second MOS transistors as a constant current source and provided with same polarity as said first MOS transistor;
    said input voltage is applied to the gate of said first MOS transistor, said reference voltage is applied to the gate of said second MOS transistor, and the drains of said first and second MOS transistors are connected to said first addition input end of said adder circuit.

7. A hysteresis comparator circuit, according to claim 1, wherein:
    said second differential input circuit is composed of first and second MOS transistors with same polarity, and a third MOS transistor connected to the sources of said first and second MOS transistors as a constant current source and provided with same polarity as said first MOS transistor;
    output voltage of said attenuator is applied to the gates of said first and second MOS transistor, and the drains of said first and second MOS transistors are connected to said second addition input end of said adder circuit.

8. A hysteresis comparator circuit, according to claim 1, wherein said adder circuit comprises:
    a first current mirror circuit that is composed of first and second MOS transistors with same polarity and a third MOS transistor with reverse polarity to that of said first and second MOS transistors, both the sources of said first and second MOS transistors being connected to a high-potential power source, the gates of said first and second MOS transistors being connected to the drain of said second MOS transistor, this connection point corresponding to said first addition input end, said third MOS transistor comprising a drain connected to the drain of said first MOS transistor corresponding to an output end to said quantizer and a source connected to a low-potential power source; and
    a second current mirror circuit that is composed of fourth and fifth MOS transistors with same polarity and a sixth MOS transistor with reverse polarity to that of said fourth and fifth MOS transistors, both the sources of said fourth and fifth MOS transistors being connected to a high-potential power source, the gates of said fourth and fifth MOS transistors being connected to the drain of said fifth MOS transistor, this connection point corresponding to said second addition input end, said sixth MOS transistor comprising a gate that is connected to its drain and the drain of said fifth MOS transistor and is connected to the gate of said third MOS transistor, and a source connected to a low-potential power source.

9. A hysteresis comparator circuit, according to claim 1, wherein:
    said attenuator comprises a plurality of resistors that give two kinds of output voltages by dividing voltage between the first and second output ends of said quantizer.

10. A hysteresis comparator circuit, according to claim 5, wherein:
    said attenuator comprises a plurality of resistors that give two kinds of output voltages by dividing voltage between the first and second output ends of said quantizer.

11. A hysteresis comparator circuit, according to claim 1, wherein:
    said quantizer comprises a first inverter that inverts output voltage of said adder circuit and then outputs it to the fist input end of said attenuator, and a second inverter that inverts output voltage of said first inverter and then outputs it to the second input end of said attenuator.

* * * * *